United States Patent
Huang

(10) Patent No.: US 9,250,278 B2
(45) Date of Patent: Feb. 2, 2016

(54) CAPACITIVE SENSING CIRCUIT FOR SENSING CAPACITANCE VARIATION WITH CHARGE CLONE

(71) Applicant: ANAPEX TECHNOLOGY INC., Hsinchu (TW)

(72) Inventor: Tsung Wen Huang, Hsinchu (TW)

(73) Assignee: Anapex Technology Inc., Jhubei, Hsinchu (TW)

( * ) Notice: Subject to any disclaimer, the term of this patent is extended or adjusted under 35 U.S.C. 154(b) by 56 days.

(21) Appl. No.: 14/300,685

(22) Filed: Jun. 10, 2014

(65) Prior Publication Data

US 2015/0145534 A1   May 28, 2015

(30) Foreign Application Priority Data

Nov. 28, 2013  (TW) .............................. 102143600 A

(51) Int. Cl.
| | |
|---|---|
| G01R 27/26 | (2006.01) |
| G06F 3/041 | (2006.01) |
| H03K 17/96 | (2006.01) |
| G01D 5/24 | (2006.01) |
| G06F 3/044 | (2006.01) |

(52) U.S. Cl.
CPC .............. G01R 27/2605 (2013.01); G01D 5/24 (2013.01); G06F 3/044 (2013.01); H03K 17/962 (2013.01); H03K 2217/96074 (2013.01); H03K 2217/960725 (2013.01); H03K 2217/960745 (2013.01)

(58) Field of Classification Search
CPC ....... G01D 5/24; G01D 5/241; G01D 5/2412; G01D 5/2417; G01R 27/2605; G06F 3/044; H03K 17/962; H03K 2217/960725; H03K 2217/96074; H03K 2217/960745
USPC ......... 324/600, 649, 658, 661, 662, 663, 669, 324/671, 676, 678, 679, 684, 686, 76.76; 345/173, 174; 702/47, 52
See application file for complete search history.

(56) References Cited

U.S. PATENT DOCUMENTS

| | | | | |
|---|---|---|---|---|
| 5,969,513 | A * | 10/1999 | Clark ...................... | G05F 3/262 323/282 |
| 2012/0112775 | A1* | 5/2012 | Domes ................... | H03K 17/18 324/686 |
| 2015/0084916 | A1* | 3/2015 | Han ........................ | G06F 3/044 345/174 |

* cited by examiner

*Primary Examiner* — Hoai-An D Nguyen
(74) *Attorney, Agent, or Firm* — Rosenberg, Klein & Lee

(57) ABSTRACT

The present invention provides a capacitive sensing circuit, comprising at least one capacitor to be measured, an integral capacitor, a first current mirror having a first current path and a second current path. A first current is generated in the first current path so as to charge the capacitor to be measured, while a second current mirrored from the first current is generated in the second current path so as to charge the integral capacitor. As such, the mirrored current, resulted from mirroring the charging current on the capacitor to be measured, is used to charge the integral capacitor. Charge energy charged on the capacitor to be measured may be copied onto the integral capacitor so as to reflect a voltage signal. Subsequently, capacitance variation generated when the capacitor to be measured is touched may be sensed by detecting the voltage signal.

10 Claims, 11 Drawing Sheets

CAPACITIVE SENSING CIRCUIT FOR SENSING CAPACITANCE VARIATION WITH CHARGE CLONE

FIELD OF THE INVENTION

The present invention is related to a capacitive sensing circuit, particularly to a capacitive sensing circuit for sensing capacitance variation with charge clone.

BACKGROUND

Recently, consumer electronics are becoming increasingly popular. Capacitive touch panels have become indispensable input interface for consumer electronics, so as to allow users to operate the electronic devices easily. The electronic devices are capable of detecting touch points depending upon capacitance variation generated when the capacitive touch panels are touched by the users.

Referring to FIGS. 1(A) and 1(B), there are shown circuit structure diagrams of a conventional capacitive sensing circuit, respectively. As illustrated in the figures, the capacitive sensing circuit 100 is applied in an electronic device having a capacitive touch panel. The capacitive sensing circuit 100 is used for sensing capacitance variation generated when the capacitive touch panel is touched by means of charge transfer.

The capacitive sensing circuit 100 comprises a capacitor to be measured ($C_X$) 11, an integral capacitor ($C_{INT}$) 12 and a switch 13, in which capacitance of the integral capacitor 12 is much higher than capacitance of the capacitor to be measured 11. The capacitor to be measured 11 is composed of at least one touch capacitor ($C_{TOUCH}$) and at least one parasitic capacitor ($C_{PAD}$, $C_{ITO}$), where $C_X = C_{TOUCH} + C_{PAD} + C_{ITO}$. When the capacitive touch panel is touched, capacitance of the touch capacitor ($C_{TOUCH}$) is varied, such as, 0 pF→1 pF, along with touch operations. Furthermore, the one end of the switch 13 is connected to the capacitor to be measured 11, while the other end of the switch 13 is selected to switch to the power supply ($V_{DD}$) or the integral capacitor 12.

The capacitive sensing circuit 100 is started to perform charge transfer process as follows. Firstly, as illustrated in FIG. 1(A), the switch 13 is controlled to switch to the power supply $V_{DD}$, allowing for a charging current $I_C$ generated from the power supply $V_{DD}$ to charge the capacitor to be measured 11. Subsequently, as illustrated in FIG. 1(B), the switch 13 is controlled to switch to the integral capacitor 12 after the capacitor to be measured 11 is fully charged, allowing for discharging the capacitor to be measured 11. A discharging current $I_D$ from the capacitor to be measured 11 is used to charge the integral capacitor 12. The charge energy of the capacitor to be measured 11 is then transferred to the integral capacitor 12, such that a voltage signal $V_{INT}$ is generated on the integral capacitor 12.

The switch 13 may be controlled by the capacitive sensing circuit 100 to switch between the power supply $V_{DD}$ and the integral capacitor 12 several times repeatedly, so as to enlarge capacitance variation of the capacitor to be measured 11, due to extremely small capacitance variation generated on touch of the capacitor to be measured 11. Then, charge energy charged on the capacitor to be measured 11 may be transferred to the integral capacitor 12 several times, such that the voltage signal $V_{INT}$ may be accumulated to be enlarged.

Subsequently, referring to FIG. 2, there is shown a curve diagram of voltage signal generated on the integral capacitor by the conventional capacitive sensing circuit. In this case, $C_{PAD} + C_{ITO} = 25$ pF, $C_{TOUCH} = 0$ pF→1 pF, $C_{INT} = 100$ pF may be taken as the operating standard of the capacitive sensing circuit 100. Before the capacitive touch panel is touched, capacitance of the capacitor to be measured 11 is $C_X = 25$ pF. A pre-touch voltage signal curve 120 is obtained through repeated charge transfer processes performed between the capacitor to be measured 11 and the integral capacitor 12. After the capacitive touch panel is touched, the capacitor to be measured 11 is varied as $C_X = 25$ pF→26 pF. The other post-touch voltage signal curve 121 is obtained through another repeated charge transfer processes additionally performed between the capacitor to be measured 11 and the integral capacitor 12.

The post-touch capacitor to be measured ($C_X = 26$ pF) 11 may be fully charged with charge energy, which is more than that fully charged on the pre-touch capacitor to be measured ($C_X = 25$ pF) 11. Therefore, more charge energy may be transferred from the post-touch capacitor to be measured ($C_X = 26$ pF) 11 to the integral capacitor 12, such that the potential of post-touch voltage signal curve 121 may be higher than that of pre-touch voltage signal curve 120. Moreover, when the difference in potential between the voltage signal curves 120 and 121 is larger than a predetermined difference, capacitance variation generated when the capacitive touch panel is touched may be sensed by the electronic device.

In the manner of charge transfer, charge transfer is carried out by means of voltage difference between the capacitor to be measured 11 and the integral capacitor 12 primarily. At the beginning of charge transfer process, the voltage difference between the capacitor to be measured 11 and the integral capacitor 12 is the largest, such that a higher discharging current $I_D$ may be provided by the capacitor to be measured 11 for charging the integral capacitor 12, thus transferring charge energy of the capacitor to be measured 11 to the integral capacitor 12 entirely, resulting in a larger extent in raising the potential of the voltage signal $V_{INT}$. In the continuous charge transfer process, the discharging current $I_D$ becomes smaller as the voltage difference between the capacitor to be measured 11 and the integral capacitor 12 is smaller and smaller, such that transferring charge energy from the capacitor to be measured 11 to the integral capacitor 12 is harder and harder, resulting in smaller and smaller extent in raising the potential of the voltage signal $V_{INT}$. The capacitive sensing circuit 100 is then necessary to perform charge transfer process more times, due to the smaller and smaller extent in raising the potential of the voltage signal $V_{INT}$, so as to enlarge the difference in potential between the voltage signal curves 120 and 121 over the predetermined difference. Thereby, time for sensing capacitance variation is prolonged correspondingly, thus being detrimental to real-time operation on touch.

SUMMARY OF THE INVENTION

It is one object of the present invention to provide a capacitive sensing circuit for sensing capacitance variation with charge clone, the capacitive sensing circuit comprises a capacitor to be measured capable of generating capacitance variation on touch, at least one current mirror and an integral capacitor, in which the current mirror generates a charging current for charging the capacitor to be measured, and meanwhile, the current mirror generates a mirrored current through mirroring the charging current, the mirrored current is used for charging the integral capacitor. Then, charge energy charged on the capacitor to be measured is copied onto the integral capacitor correspondingly through mirroring by the current mirror to reflect a voltage signal on the integral capacitor. Subsequently, capacitance variation generated when the capacitor to be measured is touched may be sensed by detecting the voltage signal.

It is one object of the present invention to provide a capacitive sensing circuit for sensing capacitance variation with charge clone, the capacitive sensing circuit being capable of performing charging/discharging processes several times with respect to the capacitor to be measured and copying charge energy charged on the capacitor to be measured onto the integral capacitor several times by means of charge clone, whereby the voltage signal on the integral capacitor may be enlarged. Furthermore, when each charge clone process is performed, charge energy charged on the capacitor to be measured may be all copied onto the integral capacitor entirely, such that extent in raising the potential of the voltage signal on the integral capacitor may be remained constant.

It is one object of the present invention to provide a capacitive sensing circuit for sensing capacitance variation with charge clone, the capacitive sensing circuit being capable of copying charge energy charged on the capacitor to be measured and charge energy discharged from the capacitor to be measured both onto the integral capacitor, whereby the enlargement of the voltage signal on the integral capacitor may be accelerated.

It is one object of the present invention to provide a capacitive sensing circuit for sensing capacitance variation with charge clone, the circuit of which is additionally provided with a current source, the current source is connected in parallel with the integral capacitor and used for discharging charge energy contributed by parasitic capacitors from the integral capacitor so as to obtain a voltage signal with lower potential on the integral capacitor. Then, this voltage signal with lower potential may be enlarged by higher multiplying factor by the capacitive sensing circuit, so as to magnify capacitance variation generated due to touch operations, whereby sensitivity of sensing touch is enhanced.

To achieve above objects, the present invention provides a capacitive sensing circuit for sensing capacitance variation with charge clone, comprising: a first current mirror comprising a first current path and a second current path; at least one capacitor to be measured; an integral capacitor connected to the second current path; a first switch, connected between the capacitor to be measured and the first current path, turning on wiring between the first current path and the capacitor to be measured when the first switch is closed, such that a first current is generated in the first current path to charge the capacitor to be measured, and meanwhile, a second current mirrored from the first current is generated in the second current path to charge the integral capacitor, thus copying charge energy charged on the capacitor to be measured onto the integral capacitor and generating a voltage signal on the integral capacitor; and a second switch, connected between the capacitor to be measured and the ground, operatively switched reversely with respect to the first switch, such that wiring between the first current path and the capacitor to be measured is opened, while wiring between the capacitor to be measured and the ground is turned on for discharging the capacitor to be measured, when the first switch is opened while the second switch is closed.

In one embodiment of the present invention, wherein the capacitor sensing circuit is applied in an electronic device having a capacitive touch panel, the capacitor to be measured comprising at least one touch capacitor and at least one parasitic capacitor, capacitance of the touch capacitor being varied when the capacitive touch panel is touched.

In one embodiment of the present invention, wherein the capacitive sensing circuit is connected to a microcontroller, the microcontroller being allowed to obtain variation of the voltage signal generated on the integral capacitor before and after the capacitive touch panel being touched.

In one embodiment of the present invention, wherein the first switch and the second switch are controlled to perform switching operations several times, in such a way that charging/discharging processes are carried out repeatedly with respect to the capacitor to be measured, the voltage signal being accumulated on the integral capacitor once after each charging process is performed.

In one embodiment of the present invention, wherein the second current path is further connected a current source, the current source is connected with the integral capacitor in parallel, the current source being set to be equivalent to a current distributed to the parasitic capacitor on charging the capacitor to be measured with the first current.

The present invention further provides a capacitive sensing circuit for sensing capacitance variation with charge clone, comprising: a first current mirror comprising a first current path and a second current path; a second current mirror comprising a third current path and a fourth current path; a third current mirror comprising a fifth current path and a sixth current path, in which the fourth current path is connected to the fifth current path; at least one capacitor to be measured; an integral capacitor connected to the second current path and the sixth current path, respectively; a first switch, connected between the capacitor to be measured and the first current path, turning on wiring between the first current path and the capacitor to be measured when the first switch is closed, such that a first current is generated in the first current path to charge the capacitor to be measured, and meanwhile, a second current mirrored from the first current is generated in the second current path; and a second switch, connected between the capacitor to be measured and the third current path, operatively switched reversely with respect to the first switch, such that when the first switch is opened while the second switch is closed, wiring between the first current path and the capacitor to be measured is turned off, while wiring between the capacitor to be measured and the third current path is turned on for discharging the capacitor to be measured to generate a third current flowing to the third current path, followed by generating a fifth current in the fifth current path and a sixth current in the sixth current path through mirroring the third current, the fifth current flowing to the fourth current path, the sixth current flowing to the integral capacitor, wherein when a charging process is performed on the capacitor to be measured, closing the first switch together with opening the second switch so as to charge the integral capacitor by the second current generated in the second current path, thus copying charge energy charged on the capacitor to be measured onto the integral capacitor and generating a voltage signal on the integral capacitor, alternatively, when a discharging process is performed on the capacitor to be measured, opening the first switch together with closing the second switch so as to charge the integral capacitor by the sixth current generated in the sixth current path again, thus copying charge energy discharged from the capacitor to be measured onto the integral capacitor and accumulating the voltage signal on the integral capacitor once again.

In one embodiment of the present invention, wherein the first switch and the second switch are controlled to perform switching operations several times, in such a way that charging/discharging processes are carried out repeatedly with respect to the capacitor to be measured, the voltage signal being accumulated on the integral capacitor once after each charging process or discharging process is performed.

DETAILED DESCRIPTION

Figure 3:
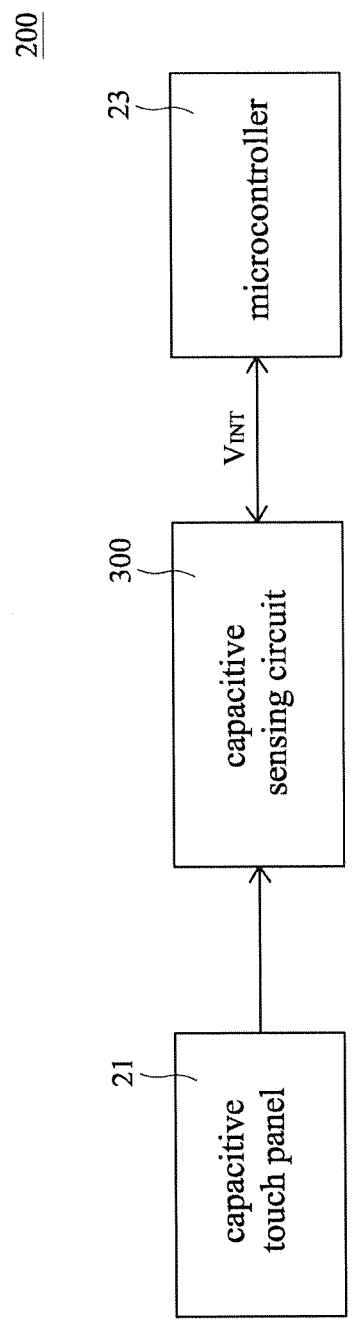
FIG. 3 is a structural block diagram of an electronic device of the present invention.

Referring to FIGS. 3, there is shown a structural block diagram of an electronic device of the present invention. As illustrated in this figure, the electronic device 200 of the present invention may be an LCD monitor, smart phone, tablet computer, notebook, portable electronic device and etc. The electronic device 200 comprises a capacitive touch panel 21, a capacitive sensing circuit 300 and a microcontroller 23. In this case, the capacitive sensing circuit 300 is connected to the capacitive touch panel 21 and the microcontroller 23, respectively.

When the capacitive touch panel 21 is touched by a user, the capacitive sensing circuit 300 is used for sensing capacitance variation generated in the capacitive touch panel 21, and transferring the capacitance variation into a voltage signal $V_{INT}$ to be presented. Afterwards, the microcontroller 23 is used to detect the voltage signal $V_{INT}$, and perform corresponding touch operations with respect to the electronic device 200 depending upon the voltage signal $V_{INT}$.

Figure 4:
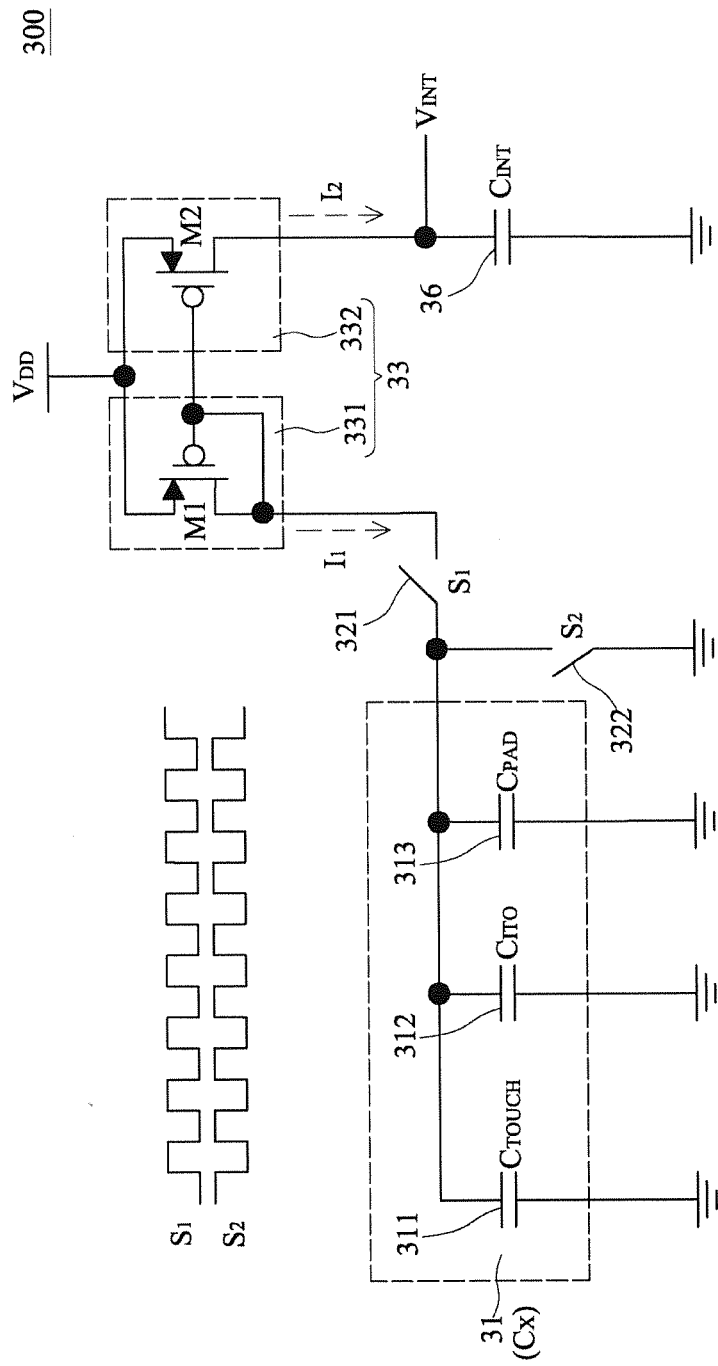
FIG. 4 is a circuit structure diagram of a capacitive sensing circuit according to one preferred embodiment of the present invention.

Referring to FIG. 4, there is shown a circuit structure diagram of a capacitive sensing circuit according to one preferred embodiment of the present invention. As illustrated in this figure, the capacitive sensing circuit 300 comprises at least one capacitor to be measured ($C_X$) 31, a first switch ($S_1$) 321, a second switch ($S_2$) 322, a first current mirror 33 and an integral capacitor ($C_{INT}$) 36.

The capacitor to be measured 31 comprises at least one touch capacitor ($C_{TOUCH}$) 311 provided in the capacitive touch panel 21, and at least one parasitic capacitor ($C_{PAD}$, $C_{ITO}$) 312, 313, in which these parasitic capacitors 312, 313 are parasitized in the internal circuit and circuit layout of the electronic device 200. When the capacitive touch panel 21 is touched, capacitance of the touch capacitor 311 may be varied on touch operations.

The first current mirror 33 comprises a first current path 331 and a second current path 332. The first current path 331 is composed of one PMOS transistor $M_1$ connected as a diode, while the second current path 332 is composed of the other PMOS transistor $M_2$. The first switch 321 is connected between the capacitor to be measured 31 and the first current path 331, while the second switch 322 is connected between the capacitor to be measured 31 and the ground. Moreover, the integral capacitor 36 is connected to the second current path 332. Furthermore, when the capacitive sensing circuit 300 of the present invention is operated, the first switch 321 and the second switch 322 are operatively switched reversely with respect to each other.

When the capacitive sensing circuit 300 is operated, it is the first thing to control the first switch 321 to close and the second switch 322 to open, such that wiring between the first current path 331 and the capacitor to be measured 31 is turned on, while wiring between the capacitor to be measured 31 and the ground is turned off. A first current $I_1$ is generated in the first current path 331, and then allowed to flow toward the capacitor to be measured 31 to charge the capacitor to be measured 31. In the meantime, a second current $I_2$ mirrored from the first current $I_1$ is generated in the second current path 332, and then allowed to flow toward the integral capacitor 36 to charge the integral capacitor 36. Thus, the charge energy charged on the capacitor to be measured 31 may be copied correspondingly onto the integral capacitor 36 through the mirroring of the first current mirror 33, in such a way that a voltage signal $V_{INT}$ may be reflected on the integral capacitor 36.

After the capacitor to be measured 31 is fully charged, it is followed by controlling the first switch 321 to open and the second switch 322 to close, such that wiring between the first current path 331 and the capacitor to be measured 31 is turned off, while wiring between the capacitor to be measured 31 and the ground is turned on. The charge energy stored on the capacitor to be measured 31 is then discharged, while the integral capacitor 36 is not charged at this time.

After the capacitor to be measured 31 is discharged completely, it is repeated to control the first switch 321 to close and the second switch 322 to open, such that next charging process may be performed on the capacitor to be measured 31 successively. Switching operations of the first switch 321 and the second switch 322 may be controlled repeatedly, so as to charge/discharge the capacitor to be measured 31 repeatedly. After each charging process is performed on the capacitor to be measured 31, the voltage signal $V_{INT}$ is accumulated on the integral capacitor 36 once, whereby the voltage signal $V_{INT}$ is enlarged.

Accordingly, charge energy charged on the capacitor to be measured 31 is copied onto the integral capacitor 36 by the capacitive sensing circuit 300 of the present invention with charge clone. Then, the voltage signal $V_{INT}$ is reflected by the integral capacitor 36 depending upon the copied charge energy. Subsequently, capacitance variation generated in the touched capacitor to be measured 31 may be sensed by the microcontroller 23 via detecting the voltage variation of this voltage signal $V_{INT}$.

Figure 1:
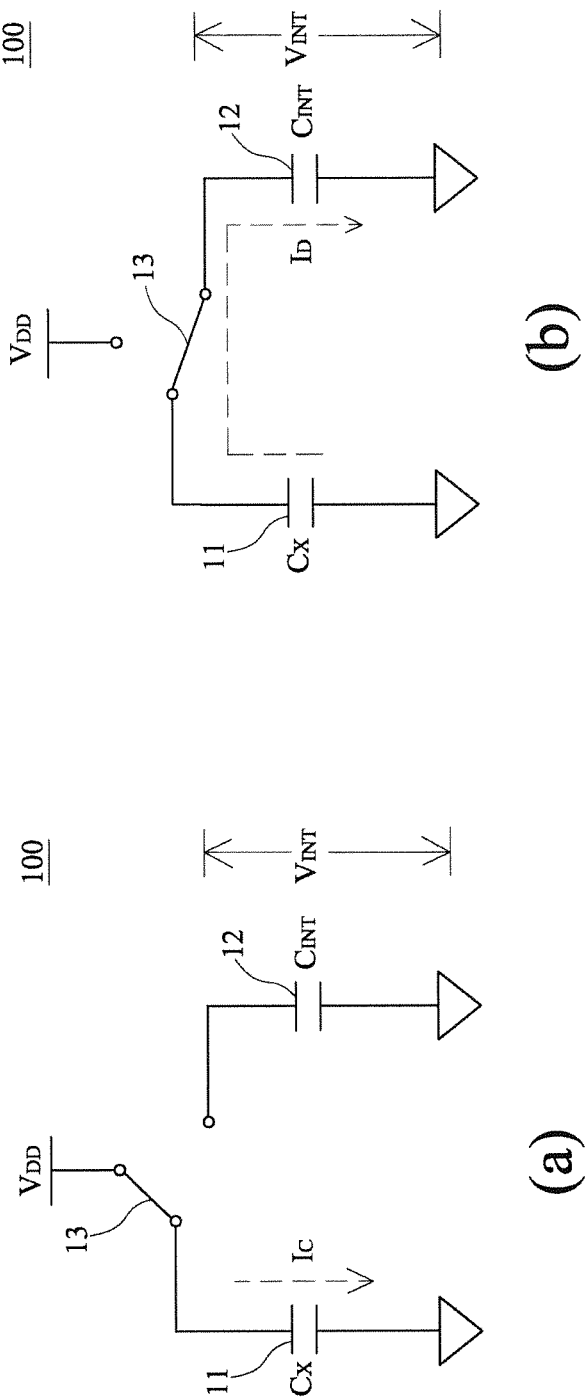
FIG. 1(A) is a circuit structure diagram of a conventional capacitive sensing circuit.
FIG. 1(B) is a further circuit structure diagram of the conventional capacitive sensing circuit.
Figure 2:
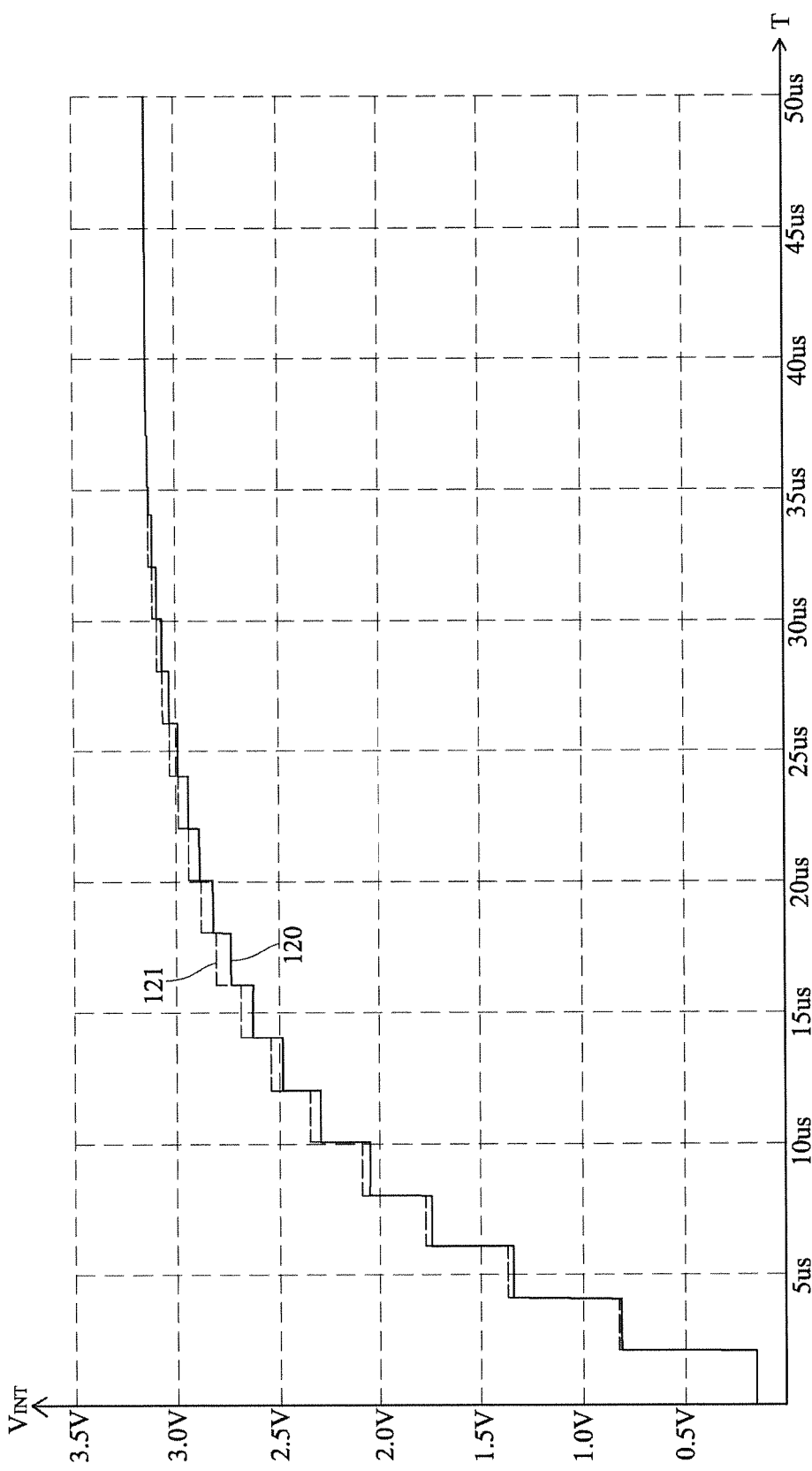
FIG. 2 illustrates a curve diagram of voltage signal generated on an integral capacitor by the conventional capacitive sensing circuit.
Figure 5:
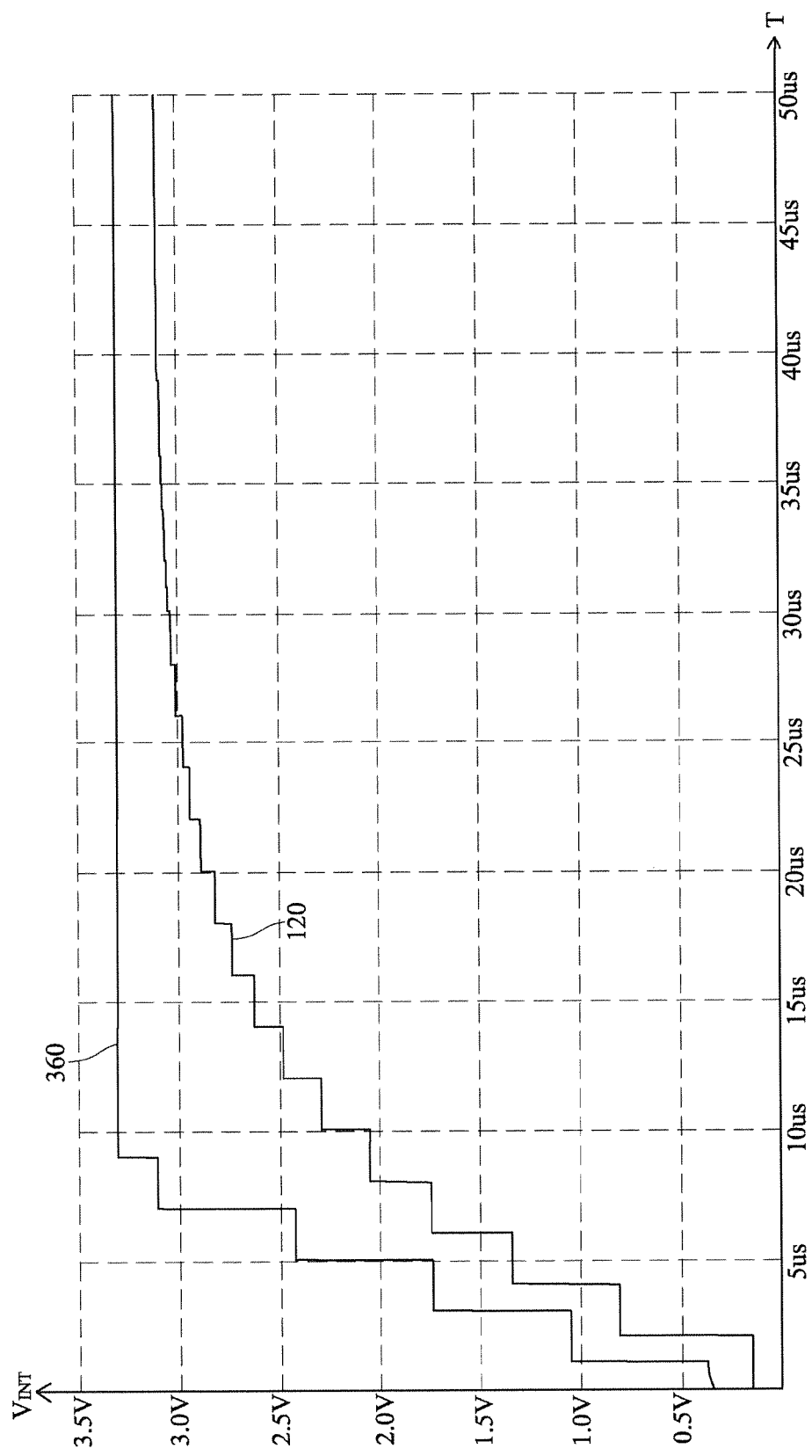
FIG. 5 illustrates a curve diagram of voltage signals generated on integral capacitors when the capacitive sensing circuit of embodiment in FIG. 4 of the present invention and the conventional capacitive sensing circuit in FIG. 1 of the prior art are operated, respectively.

Referring to FIG. 5, there is shown a curve diagram of voltage signals generated on integral capacitors when the capacitive sensing circuit of embodiment in FIG. 4 of the present invention and the conventional capacitive sensing circuit in FIG. 1 of the prior art are operated, respectively. In this case, the capacitor to be measured ($C_X$=25 pF) 11/31 and the integral capacitor ($C_{INT}$=100 pF) 12/36 may be taken as the operating standard of the capacitive sensing circuit 100, 300. As illustrated in the figure, charge energy charged on the capacitor to be measured 11 may be transferred to the integral capacitor 12 by the conventional capacitive sensing circuit 100 with charge transfer. After repeated charge transfer, a voltage signal curve 120 is obtained. Additionally, charge energy charged on the capacitor to be measured 31 is copied onto the integral capacitor 36 by the capacitive sensing circuit 300 of the present invention with charge clone. After repeated charge clone, a voltage signal curve 360 is obtained.

In the conventional manner of charge transfer, as illustrated by the voltage signal curve 120, charge transfer is primarily carried out on the basis of voltage difference between the capacitor to be measured 11 and the integral capacitor 12. This voltage difference therebetween may be reduced gradually as charge is transferred, leading to a worse and worse effect of charge transfer. Then, on subsequently performed process of charge transfer, the extent in raising the potential of voltage signal $V_{INT}$ is smaller and smaller. As illustrated by the voltage signal curve 360, correspondingly, mirroring the first current $I_1$ in the capacitor to be measured 31 is primarily used by charge clone of the present invention. The mirrored second current $I_2$ is equivalent to the first current $I_1$, in such a way that charge energy charged on the capacitor to be measured 31 may be copied onto the integral capacitor 36 entirely. Then, when subsequent charge clone is performed once again, the extent in raising the potential of the voltage signal $V_{INT}$ may be remained constant.

In this case, in comparison with the conventional capacitive sensing circuit 100 using charge transfer, the capacitive sensing circuit 300 of the present invention, using charge clone, is allowed to enlarge the voltage signal rapidly, further accelerating the sensing of capacitance variation of the capacitor to be measured 31.

In the present invention, moreover, the capacitor to be measured 31 further comprises numerous unexpected parasitic capacitors 312, 313, besides the touch capacitor 311. The capacitance of parasitic capacitors 312, 313 is often larger than capacitance variation of the touch capacitor 311. When the touch capacitor 311 is charged by the first current $I_1$, the parasitic capacitors 312, 313 connected in parallel with the touch capacitor 311 may be charged thereby at the same time. Thus, when charge clone process is performed, charge energy on the touch capacitor 311 and the parasitic capacitors 312, 313 may be all copied onto the integral capacitor 36. In addition, the voltage signal $V_{INT}$ is generally enlarged for the correct determination of capacitance variation, which is often very small, of the touch capacitor 311. Multiplying factor is restricted, however, for avoiding the voltage signal $V_{INT}$ contributed by the parasitic capacitors 312, 313 to be enlarged over the permissible operating range of electronic device. In other words, the electronic device 200 is not allowed to enlarge the voltage signal $V_{INT}$ by higher multiplying factor, yielding to the parasitic capacitors 312, 313, thus being extremely detrimental to the sensing of capacitance variation of the touch capacitor 311.

Figure 6:
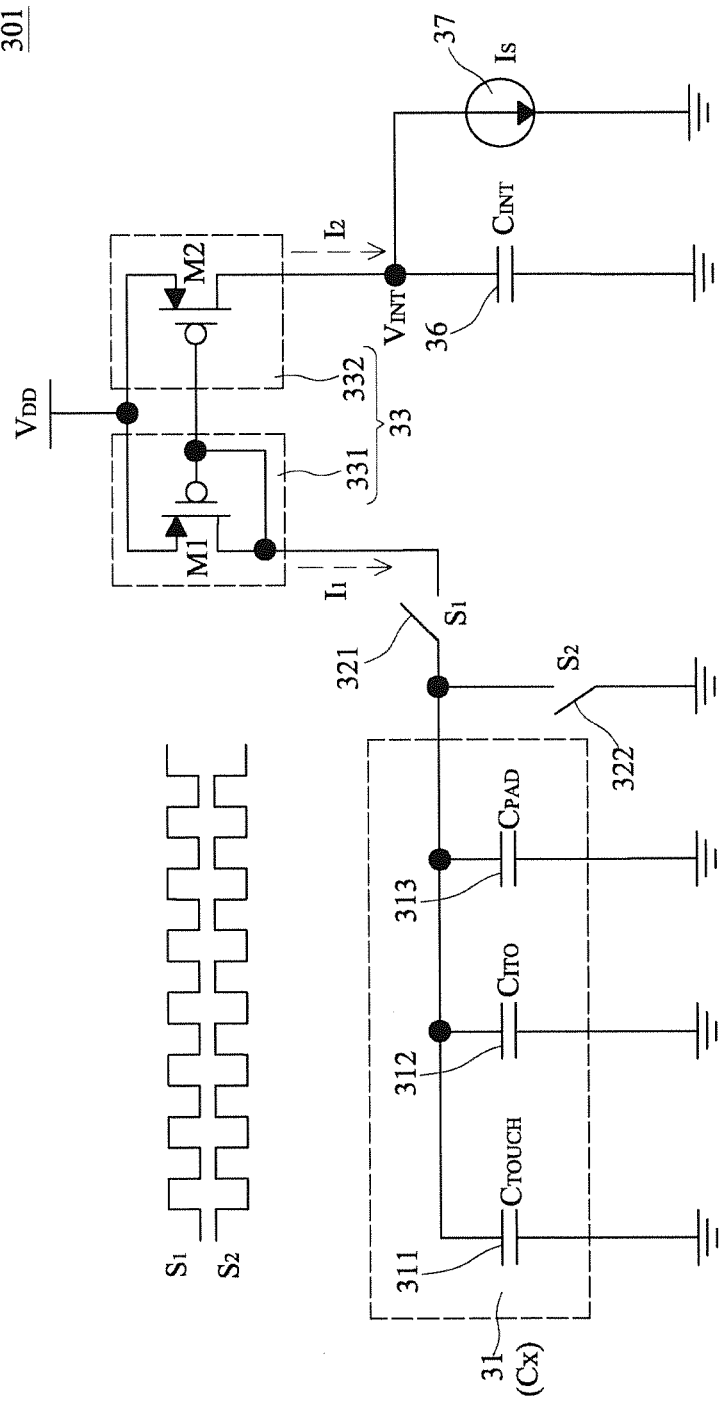
FIG. 6 is a circuit structure diagram of a capacitive sensing circuit according to a further embodiment of the present invention.

For this reason, as illustrated in FIG. 6, there is further provided in the capacitive sensing circuit 301 with a current source ($I_S$) 37, which is connected in parallel with the integral capacitor 36 and then connected to the second current path 332 together therewith, for removing charge energy contributed by the parasitic capacitors 312, 313 from the integral capacitor 36. In one preferred embodiment of the present invention, furthermore, the current source 37 is set to be equivalent to the current distributed to the parasitic capacitors 312, 313 on charging the capacitor to be measured 31 with the first current $I_1$.

Figure 7:
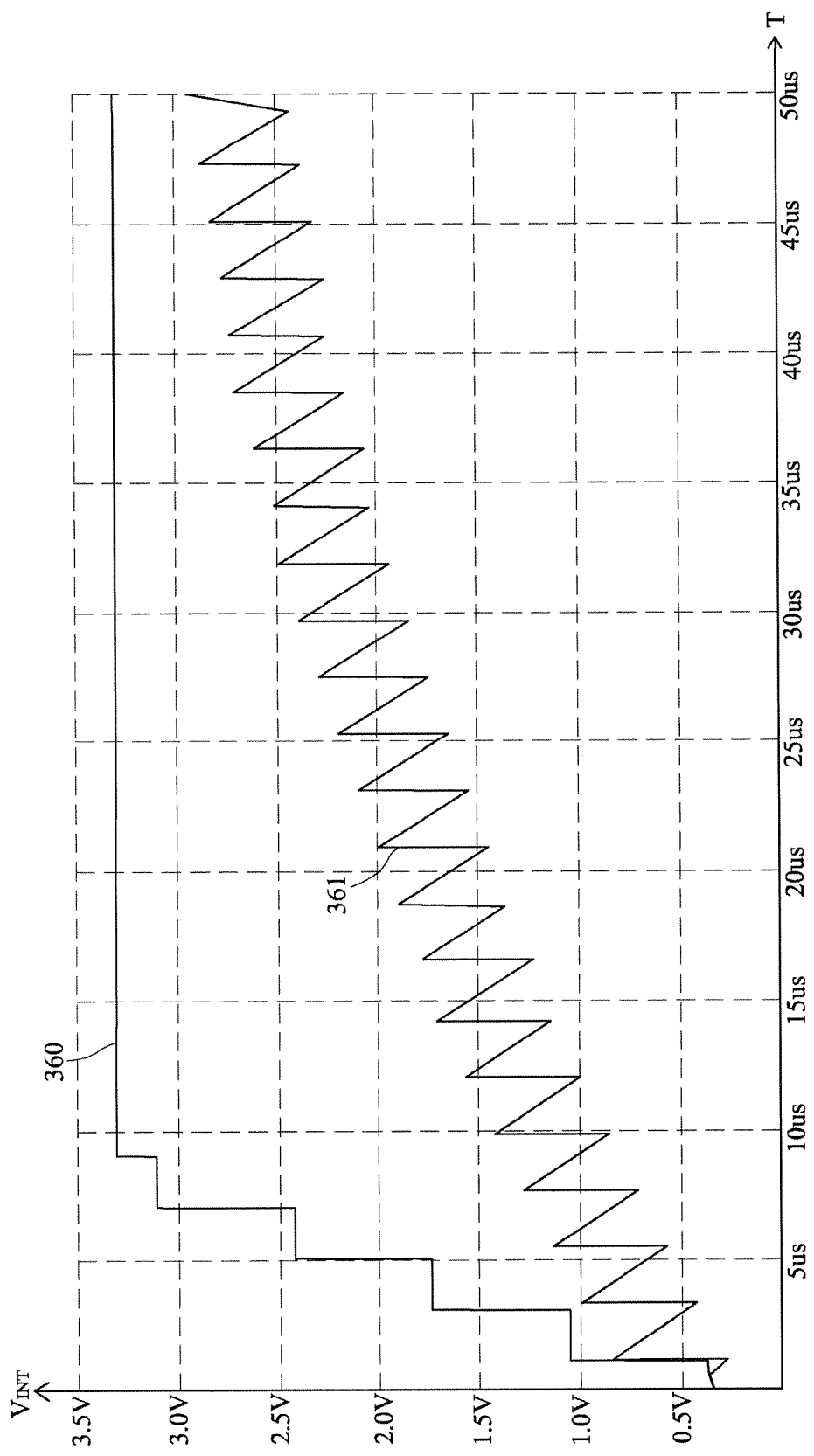
FIG. 7 illustrates a curve diagram of voltage signals generated on integral capacitors when the capacitive sensing circuit of embodiment in FIG. 4 and the capacitive sensing circuit of embodiment in FIG. 6 of the present invention are operated, respectively.

Then, as illustrated by a voltage signal curve 361 in FIG. 7, the current source 37 is provided, such that charge energy contributed by the parasitic capacitors 312, 313 partly on the integral capacitor 36 may be removed by discharging via the current source 37. In this case, the potential of voltage signal $V_{INT}$ may be lowered due to discharging via the current source 37, thus obtaining a voltage signal $V_{INT}$, which is not contributed by the parasitic capacitors 312, 313, while is situated in a lower potential.

The potential of voltage signal $V_{INT}$ on the voltage signal curve 361 is lower than that of voltage signal $V_{INT}$ on the voltage signal curve 360. Subsequently, charge clone may be performed more times by the capacitive sensing circuit 301 on this voltage signal $V_{INT}$ with lower potential, in such a way that capacitance variation of the touch capacitor 311 may be magnified due to enlargement with higher multiplying factor, whereby sensitivity of sensing touch may be enhanced.

Figure 8:
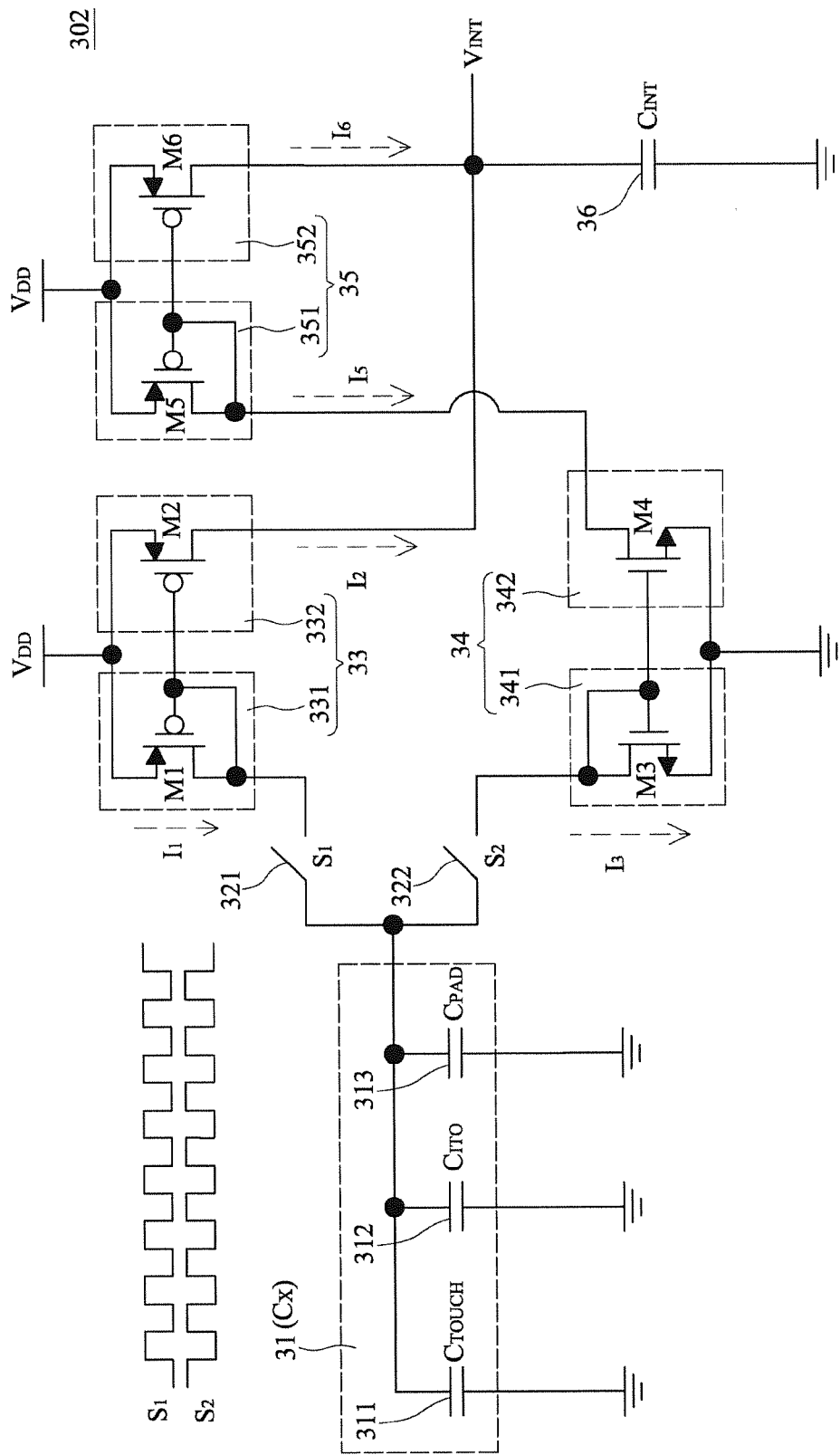
FIG. 8 is a circuit structure diagram of a capacitive sensing circuit according to a further embodiment of the present invention.

Referring to FIG. 8, there is shown a circuit structure diagram of a capacitive sensing circuit according to a further embodiment of the present invention. In comparison with the capacitive sensing circuit 300 in FIG. 4, a capacitive sensing circuit 302 of this embodiment may further comprise a second current mirror 34 and a third current mirror 35.

In this connection, the second current mirror 34 comprises a third current path 341 and a fourth current path 342, in which the third current path 341 is composed of one NMOS transistor $M_3$ connected as diode, while the fourth current path 342 is composed of the other NMOS transistor $M_4$. The third current mirror 35 comprises a fifth current path 351 and a sixth current path 352, in which the fifth current path 351 is composed of one PMOS transistor M5 connected as diode, while the sixth current path 352 is composed of the other PMOS transistor M6.

Moreover, the first switch 321 is connected between the capacitor to be measured 31 and the first current path 331, while the second switch 322 is connected between the capacitor to be measured 31 and the third current path 341. The fourth current path 342 is connected to the fifth current path 351, while the integral capacitor 36 is connected to the second current path 332 and the sixth current path 352, respectively.

When the capacitive sensing circuit 302 is operated, it is the first thing to control the first switch 321 to close and the second switch 322 to open, such that wiring between the first current path 331 and the capacitor to be measured 31 is turned on, while wiring between the capacitor to be measured 31 and the third current path 341 is turned off. A first current $I_1$ generated in the first current path 331 is allowed to flow toward the capacitor to be measured 31 to charge the capacitor to be measured 31. In the meantime, a second current $I_2$ mirrored from the first current $I_1$ is generated in the second current path 332, and then allowed to flow toward the integral capacitor 36 to charge the integral capacitor 36. Then, the charge energy charged on the capacitor to be measured 31 may be copied correspondingly onto the integral capacitor 36 through the mirroring of the first current mirror 33, in such a way that a voltage signal $V_{INT}$ may be reflected on the integral capacitor 36.

After the capacitor to be measured 31 is fully charged, it is followed by controlling the first switch 321 to open and the second switch 322 to close, such that wiring between the first current path 331 and the capacitor to be measured 31 is turned off, while wiring between the capacitor to be measured 31 and the third current path 341 is turned on. At this time, a third current $I_3$ generated by discharging the capacitor to be measured 31 is allowed to flow toward the third current path 341. In the meantime, a fifth current $I_5$ and a sixth current $I_6$, mirrored from the third current $I_3$, are generated in the fifth current path 351 and the sixth current path 352, respectively. The fifth current $I_5$ is allowed to flow toward the fourth current path 342, while the sixth current $I_6$ is allowed to flow toward the integral capacitor 36 to charge the integral capacitor 36. Then, charge energy discharged from the capacitor to be measured 31 is copied correspondingly onto the integral capacitor 36 through the mirroring of the second current mirror 34 and the third current mirror 35, in such a way that the voltage signal $V_{INT}$ is accumulated on the integral capacitor 36 once again.

After the capacitor to be measured 31 is discharged completely, it is repeated to control the first switch 321 to close and the second switch 322 to open, such that next charging process may be performed on the capacitor to be measured 31 successively. Switching operations of the first switch 321 and the second switch 322 may be controlled repeatedly, no as to charge/discharge the capacitor to be measured 31 repeatedly. After each charging process or discharging process is performed on the capacitor to be measured 31, the voltage signal $V_{INT}$ is accumulated on the integral capacitor 36 once, whereby the enlargement of voltage signal $V_{INT}$ may be accelerated further.

Figure 9:
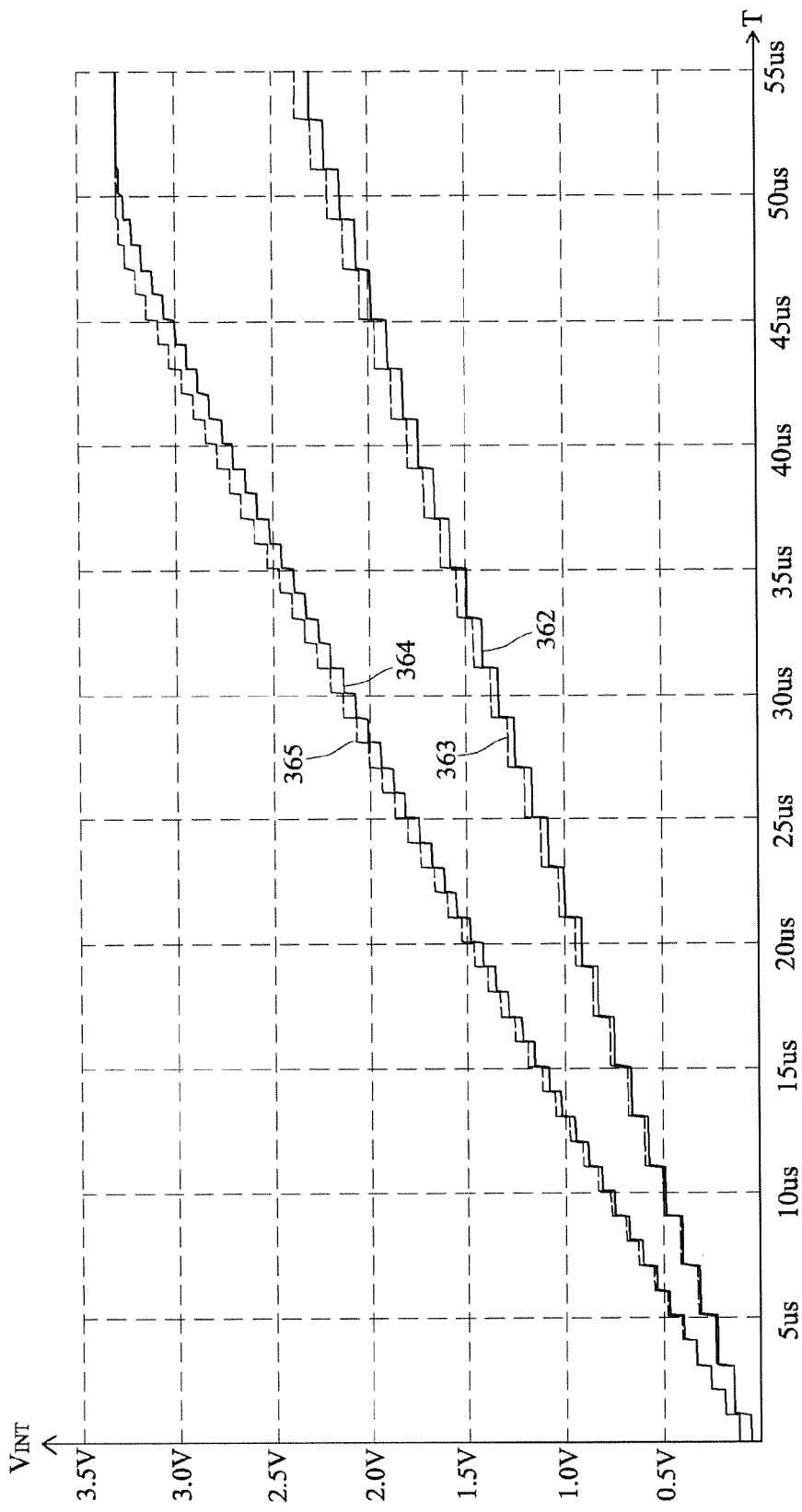
FIG. 9 illustrates a curve diagram of voltage signals generated on integral capacitors when the capacitive sensing circuit of embodiment in FIG. 4 and the capacitive sensing circuit of embodiment in FIG. 8 of the present invention are operated, respectively.

Referring to FIG. 9, there is shown a curve diagram of voltage signals generated on integral capacitors when the capacitive sensing circuit of embodiment in FIG. 4 and the capacitive sensing circuit of embodiment in FIG. 8 of the present invention are operated, respectively. In this case, the capacitor to be measured ($C_X$=25 pF→26 pF) 31, the integral capacitor ($C_{INT}$=1000 pF) 36 are taken as the operating standard for the capacitive sensing circuit 300 of the embodiment in FIG. 4 and the capacitive sensing circuit 302 of the embodiment in FIG. 8.

When the capacitive sensing circuit 300 of the embodiment in FIG. 4 is operated, charge energy charged on the capacitor to be measured 31 is copied onto the integral capacitor 36, so as to obtain a pre-touch ($C_X$=25 pF) voltage signal curve 362 and a post-touch ($C_X$=26 pF) voltage signal curve 363 on the integral capacitor 36.

Additionally, when the capacitive sensing circuit 302 of the embodiment in FIG. 8 is operated, charge energy discharged from the capacitor to be measured 31 is further copied onto the integral capacitor 36 in addition to copying charge energy charged on the capacitor to be measured 31 onto the integral capacitor 36, so as to obtain a pre-touch ($C_X$=25 pF) voltage signal curve 364 and a post-touch ($C_X$=26 pF) voltage signal curve 365 on the integral capacitor 36.

A predetermined difference of 72 mV is taken as an example of standard condition for sensing the capacitance variation of the capacitor to be measured 31. As found in the experiment, the difference in potential between the voltage signal curves 364 and 365 may be enlarged over the predetermined value of 72 mV only if the capacitive sensing circuit 302 of the embodiment in FIG. 8 is operated for 35 μs. On the contrary, the capacitive sensing circuit 300 of the embodiment in FIG. 4 must be operated for 55 μs, so as to enlarge the difference in potential between the voltage signal curves 362 and 363 over the predetermined difference of 72 mV.

Accordingly, compared with the capacitive sensing circuit 300 of the embodiment in FIG. 4, the capacitive sensing circuit 302 of the embodiment in FIG. 8 is allowed to further copy charge energy discharged from the capacitor to be measured 31 onto the integral capacitor 36, so as to accelerate the enlargement of voltage signal $V_{INT}$ more effectively. Then, the difference in potential of the voltage signal $V_{INT}$ generated on the integral capacitor 36 between pre- and post-touch may be enlarged rapidly, in such a way that capacitance variation generated when the capacitive touch panel 21 is touched may be sensed by the microcontroller 23 of the electronic device 200 as early as possible.

Figure 10:
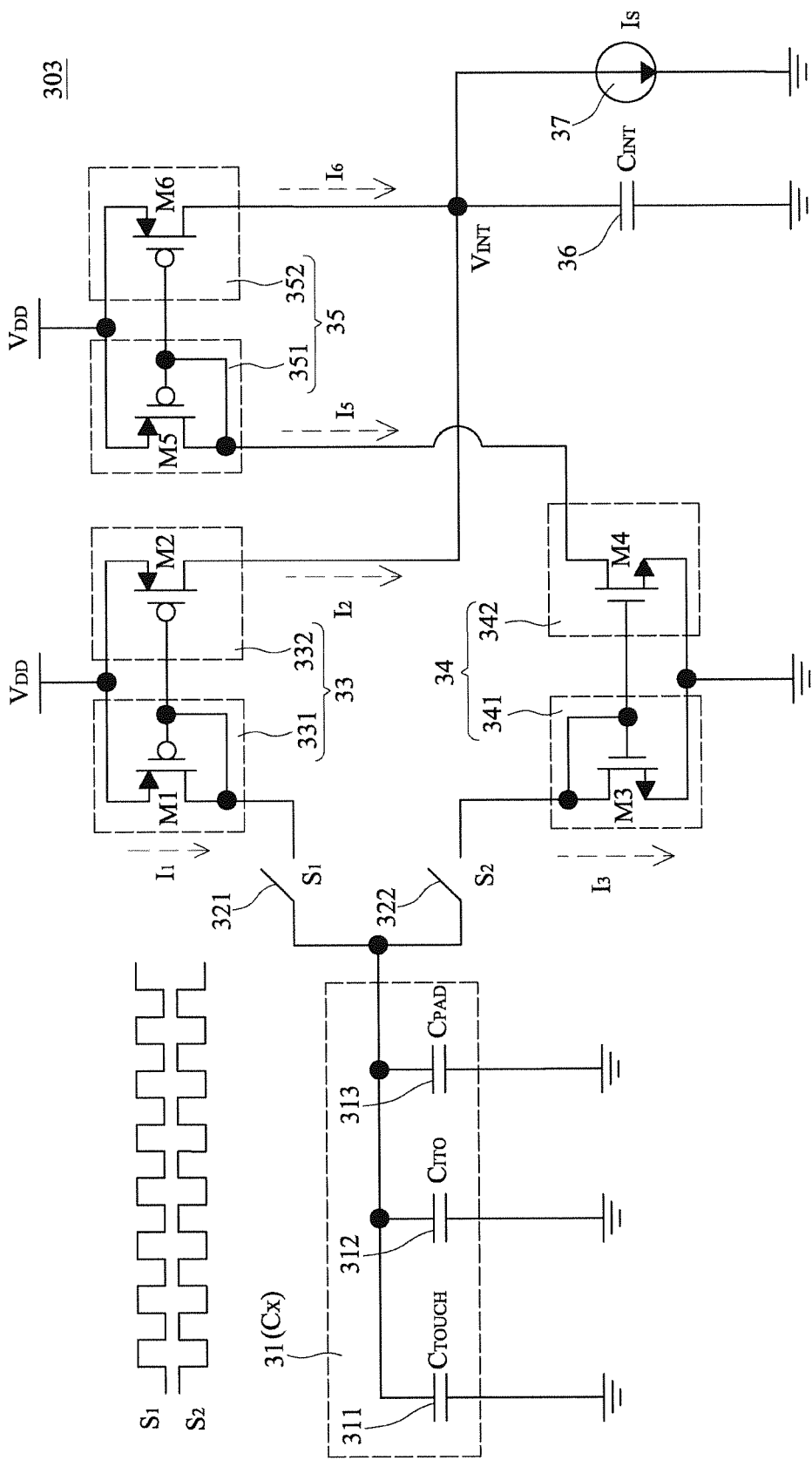
FIG. 10 is a circuit structure diagram of a capacitive sensing circuit according to a further embodiment of the present invention.

Similarly, as illustrated in FIG. 10, there is also further provided in the capacitive sensing circuit 303 with a current source 37, which is connected in parallel with the integral capacitor 36 and then connected to the second current path 332 and the sixth current path 352 together therewith, for removing charge energy contributed by the parasitic capacitors 312, 313 from the integral capacitor 36.

Figure 11:
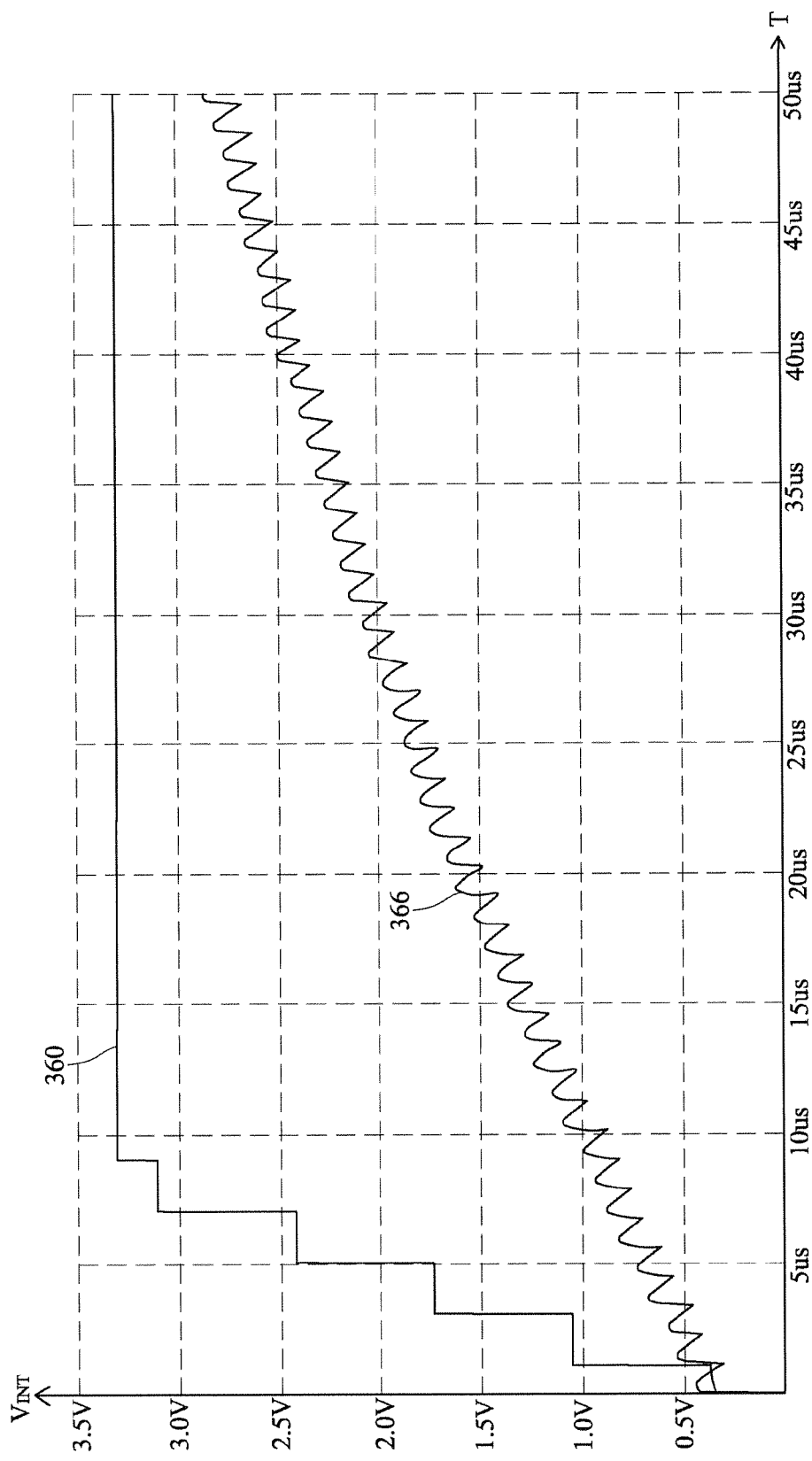
FIG. 11 illustrates a curve diagram of voltage signals generated on integral capacitors when the capacitive sensing circuit of embodiment in FIG. 4 and the capacitive sensing circuit of embodiment in FIG. 10 of the present invention are operated, respectively.

Then, as illustrated by a voltage signal curve 366 in FIG. 11, the current source 37 is provided, such that charge energy contributed by the parasitic capacitors 312, 313 partly on the integral capacitor 36 may be removed by discharging via the current source 37. In this case, the potential of voltage signal $V_{INT}$ may be lowered due to discharging via the current source 37, thus obtaining a voltage signal $V_{INT}$, which is not contributed by the parasitic capacitors 312, 313, while is situated in a lower potential.

The potential of voltage signal $V_{INT}$ on the voltage signal curve 366 is lower than that of voltage signal $V_{INT}$ on the voltage signal curve 360. Subsequently, charge clone may be performed more times by the capacitive sensing circuit 303 on this voltage signal $V_{INT}$ with lower potential, in such a way that capacitance variation of the touch capacitor 311 may be magnified due to enlargement with higher multiplying factor, whereby sensitivity of sensing touch may be enhanced.

Naturally, there are still various embodiments for the present invention. It should be understood that various changes and alterations could be made to the present invention by those skilled in the art without departing from the spirit and scope of the invention, and included within the scope of the appended claims.

The invention claimed is:

1. A capacitive sensing circuit for sensing capacitance variation with charge clone, comprising:
    a first current mirror comprising a first current path and a second current path;
    at least one capacitor to be measured;
    an integral capacitor connected to said second current path;
    a first switch, connected between said capacitor to be measured and said first current path, turning on wiring between said first current path and said capacitor to be measured when said first switch is closed, such that a first current is generated in said first current path to charge said capacitor to be measured, and meanwhile, a second current mirrored from said first current is generated in said second current path to charge said integral capacitor, thus copying charge energy charged on said capacitor to be measured onto said integral capacitor and generating a voltage signal on said integral capacitor; and
    a second switch, connected between said capacitor to be measured and the ground, operatively switched reversely with respect to said first switch, such that wiring between said first current path and said capacitor to be measured is opened, while wiring between said capacitor to be measured and the ground is turned on for discharging said capacitor to be measured, when said first switch is opened while said second switch is closed.

2. The capacitive sensing circuit according to claim 1, wherein said capacitive sensing circuit is applied in an electronic device having a capacitive touch panel, said capacitor to be measured comprising at least one touch capacitor and at least one parasitic capacitor, capacitance of said touch capacitor being varied when said capacitive touch panel is touched.

3. The capacitive sensing circuit according to claim 2, wherein said capacitive sensing circuit is connected to a microcontroller, said microcontroller being allowed to obtain variation of said voltage signal generated on said integral capacitor before and after said capacitive touch panel being touched.

4. The capacitive sensing circuit according to claim 1, wherein said first switch and said second switch are controlled to perform switching operations several times, in such a way that charging/discharging processes are carried out repeatedly with respect to said capacitor to be measured, said voltage signal being accumulated on said integral capacitor once after each charging process is performed.

5. The capacitive sensing circuit according to claim 2, wherein said second current path is further connected a current source, said current source is connected with said integral capacitor in parallel, said current source being set to be equivalent to a current distributed to said parasitic capacitor on charging said capacitor to be measured with said first current.

6. A capacitive sensing circuit for sensing capacitance variation with charge clone, comprising:
   a first current mirror comprising a first current path and a second current path;
   a second current mirror comprising a third current path and a fourth current path;
   a third current mirror comprising a fifth current path and a sixth current path, in which said fourth current path is connected to said fifth current path;
   at least one capacitor to be measured;
   an integral capacitor connected to said second current path and said sixth current path, respectively;
   a first switch, connected between said capacitor to be measured and said first current path, turning on wiring between said first current path and said capacitor to be measured when said first switch is closed, such that a first current is generated in said first current path to charge said capacitor to be measured, and meanwhile, a second current mirrored from said first current is generated in said second current path; and
   a second switch, connected between said capacitor to be measured and said third current path, operatively switched reversely with respect to said first switch, such that when said first switch is opened while said second switch is closed, wiring between said first current path and said capacitor to be measured is turned off, while wiring between said capacitor to be measured and said third current path is turned on for discharging said capacitor to be measured to generate a third current flowing to said third current path, followed by generating a fifth current in said fifth current path and a sixth current in said sixth current path through mirroring said third current, said fifth current flowing to said fourth current path, said sixth current flowing to said integral capacitor, wherein when a charging process is performed on said capacitor to be measured, closing said first switch together with opening said second switch so as to charge said integral capacitor by said second current generated in said second current path, thus copying charge energy charged on said capacitor to be measured onto said integral capacitor and generating a voltage signal on said integral capacitor, alternatively, when a discharging process is performed on said capacitor to be measured, opening said first switch together with closing said second switch so as to charge said integral capacitor by said sixth current generated in said sixth current path again, thus copying charge energy discharged from said capacitor to be measured onto said integral capacitor and accumulating said voltage signal on said integral capacitor once again.

7. The capacitive sensing circuit according to claim 6, wherein said capacitive sensing circuit is applied in an electronic device having a capacitive touch panel, said capacitor to be measured comprising at least one touch capacitor and at least one parasitic capacitor, capacitance of said touch capacitor being varied when said capacitive touch panel is touched.

8. The capacitive sensing circuit according to claim 7, wherein said capacitive sensing circuit is connected to a microcontroller, said microcontroller being allowed to obtain variation of said voltage signal generated on said integral capacitor before and after said capacitive touch panel being touched.

9. The capacitive sensing circuit according to claim 6, wherein said first switch and said second switch are controlled to perform switching operations several times, in such a way that charging/discharging processes are carried out repeatedly with respect to said capacitor to be measured, said voltage signal being accumulated on said integral capacitor once after each charging process or discharging process is performed.

10. The capacitive sensing circuit according to claim 7, wherein said second current path is further connected a current source, said current source is connected with said integral capacitor in parallel, said current source being set to be equivalent to a current distributed to said parasitic capacitor on charging said capacitor to be measured with said first current.

* * * * *